United States Patent [19]

Woodward

[11] Patent Number: 4,880,349
[45] Date of Patent: Nov. 14, 1989

[54] METHOD FOR LOCATING AND SUPPORTING CERAMIC SUBSTRATES

[75] Inventor: Daniel A. Woodward, West Palm Beach, Fla.

[73] Assignee: Northern Telecom Limited, Montreal, Canada

[21] Appl. No.: 197,574

[22] Filed: May 23, 1988

Related U.S. Application Data

[62] Division of Ser. No. 945,567, Dec. 23, 1986, Pat. No. 4,784,377.

[51] Int. Cl.$^4$ ............................................. B65G 47/00
[52] U.S. Cl. ..................................... 414/786; 29/743; 269/21; 269/317
[58] Field of Search ............... 414/786; 29/559, 564.1, 29/743, 846; 269/20, 21, 317

[56] References Cited

U.S. PATENT DOCUMENTS 4,183,545  1/1980  Daly .................................... 51/235
4,784,377 11/1988  Woodward ........................ 269/21

Primary Examiner—Robert J. Spar
Assistant Examiner—Donald W. Underwood
Attorney, Agent, or Firm—Foley & Lardner, Schwartz, Jeffery, Schwaab, Mack, Blumenthal & Evans

[57] ABSTRACT

A ceramic substrate is held in position, while being processed, by vacuum. The substrate is positioned on an intermediate plate and held down by a vacuum. The intermediate plate is supported on an air bearing while being moved into correct location on a support member, after which the intermediate plate is held in position by a vacuum. The locating of the intermediate plate can be caused to move into position during movement of the support member to a processing position. Typical processing to the screen printing of circuits and other features.

5 Claims, 7 Drawing Sheets

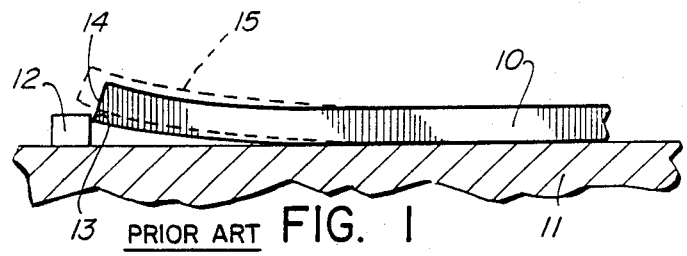
PRIOR ART FIG. 1
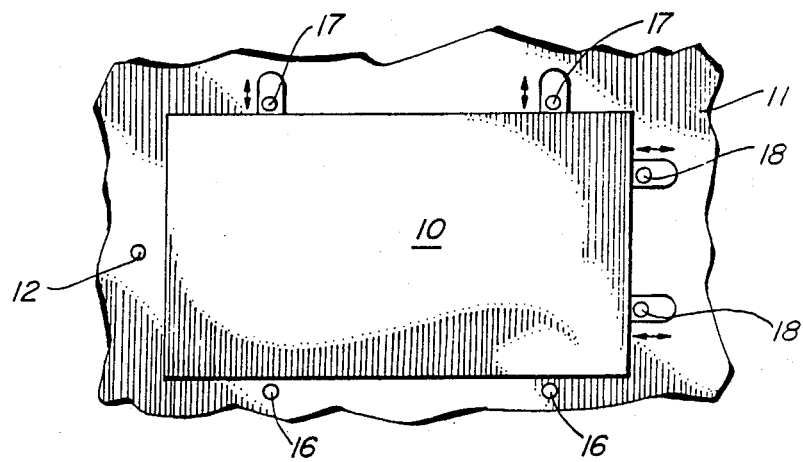
PRIOR ART FIG. 2
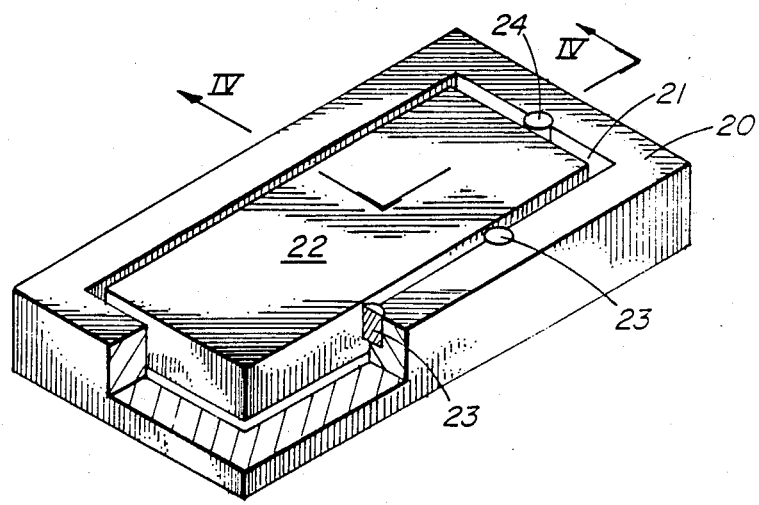
FIG. 3

METHOD FOR LOCATING AND SUPPORTING CERAMIC SUBSTRATES

This application is a division of application Ser. No. 945,567, filed Dec. 23, 1986, now U.S. Pat. No. 4,784,377.

BACKGROUND OF THE INVENTION

1. Field of the Invention

This invention relates to the location and support of ceramic substrates, particularly while the substrates are worked on, for example screen printing of circuits and other features.

2. Related Art

The present trend of ceramic substrates is to reduced thickness and larger areas. This is because thinner substrates are cheaper to make in that they contain less material. Also, it is often possible to produce several circuit boards from a single substrate and dividing the substrate into individual boards can readily be done with these substrates by scoring the substrate, for example by a laser, and then breaking by bending. Thick substrates are not as easily broken.

However, a problem arises with large ceramic substrates in that warping of the substrate can occur. This problem increases with decrease in substrate thickness. This can cause damage to one or more edges of the substrate when substrates are pushed against locating pins. It is also possible for substrates to be warped to such an extent that an edge will ride over a locating pin.

SUMMARY OF THE INVENTION

The present invention provides an apparatus in which a ceramic substrate is held down on an intermediate plate by a vacuum connection, the intermediate plate being supported on an air bearing for location, following which the intermediate plate is also held in position by vacuum. The edges of the substrate can be arranged to overhang the intermediate plate, at least locally, for accurate location of the substrate.

Broadly the invention comprises an intermediate plate, means for producing a vacuum at an upper surface of the intermediate plate, means for alternately forming an air bearing between the intermediate plate and a support member and creating a vacuum between the intermediate plate and the support member, and means for moving the intermediate plate to locate a substrate in contact with locating members in the support member while the air bearing is in being.

BRIEF DESCRIPTION OF THE DRAWINGS

The invention will be readily understood by the following description, in conjunction with the accompanying drawings, in which:

FIG. 1 is a side view of a ceramic substrate, showing possible effects of warping;

FIG. 2 is a top plan view of a conventional location arrangement;

FIG. 3 is a diagrammatic perspective view, part in section, illustrating a form of locating apparatus in accordance with the invention;

DETAILED DESCRIPTION OF THE EMBODIMENTS

Figure 4:
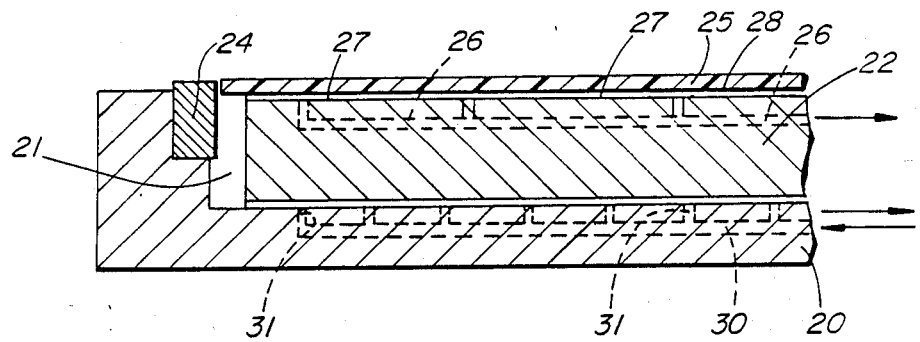
FIG. 4 is a diagrammatic partial cross-section through an apparatus as illustrated in FIG. 3, with a substrate in position, generally on the line IV—IV of FIG. 3.

FIG. 1 illustrates, very diagrammatically, situations which are likely to occur when locating and supporting thin ceramic substrates, as when screen printing thick film components for example. A substrate 10 is shown resting on a support member 11. A locating pin or similar member 12 is also shown. The substrate is often warped, particularly at the edges. This results in an edge 13 contacting the pin 12, instead of a flat surface, as indicated at 14. This is likely to result in chipping of the substrate. The pin 12 is required to have a height above the support member 11 which is less than the thickness of the substrate to avoid interfering with the printing and other processes. As a result, it is easy for the substrate to ride over the pin, particularly with a severe warping as indicated at 15.

Also, in the situation as illustrated in FIG. 1, pushing down of the substrate, as by a holding member, or by passage of a squeegee of a screen printing apparatus, the edge 13 is forced down in contact with the pin. This further increases the probability of chipping of the substrate and produces wear on the pin.

FIG. 2 illustrates a further situation which also causes pin wear and possible damage to a substrate. As illustrated in FIG. 2, the substrate 10 rests on the support member 11. There is a fixed or stationary locating pin 12 at one end, and two stationary pins 16 at one side. Also, there are a first pair of moving locating pins 17 and a second pair of moving locating pins 18.

Initially, pins 17 and 18 are in a withdrawn position and the substrate is positioned as the support member 11. The first pair of movable pins 17 are actuated to push the substrate against the opposite fixed locating pins 16. The second pair of movable pins 18 are then actuated to push the substrate 10 against the pin 12. In so pushing the substrate, pins 18 must overcome the friction between the substrate edges and the pins 16 and 17. This friction can be quite high. When the friction is overcome, the substrate is likely to move quickly and hit pin 12 hard. This is a very serious cause of chipping. Wear on pins 16 and 17 occurs and chipping of the substrate can occur when pins 18 push against the substrate. Chipping can also occur as the substrate slides against pins 16 and 17.

FIGS. 3 and 4 illustrate, diagrammatically, the present invention. A support member 20 is recessed, at 21, and an intermediate plate or similar member 22 is positioned in the recess. Intermediate plate 22 is of smaller dimensions than the recess 21 to provide a clearance around the plate 22. Locating pins 23 are provided on one side of the recess and a further locating pin 24 is provided at one end of the recess. No substrate is in position in FIG. 3, but is shown in position, at 25, in FIG. 4.

Figure 12:
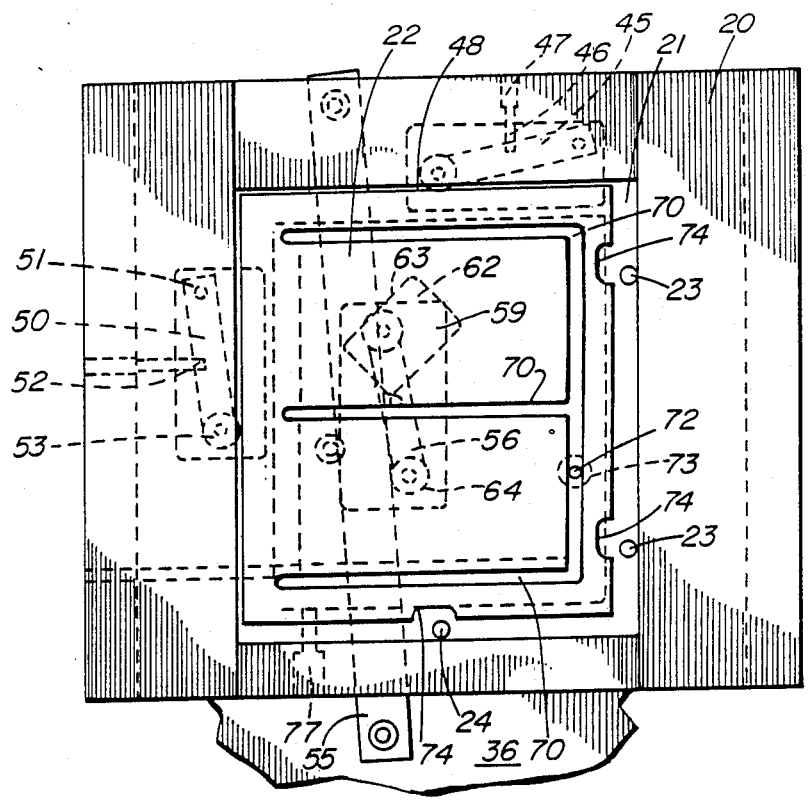
FIG. 12 is a top plan view similar to that of FIG. 11, but with the intermediate plate in position.

The arrangement of support and holding is illustrated in FIG. 4. In the intermediate plate 22 one or more passages 26 are formed. Holes 27 extend up from passage 26 to the top surface 28 of the plate 22. The passage 26 is connected to a vacuum source. This is not seen in FIG. 4 but will be illustrated and described in conjunction with FIGS. 9 and 12. By application of the vacuum source, the substrate is held down on the plate 22.

One or more passages 30 extend in the support member 20 beneath the recess 21. Holes 31 extend up from each passage 30 to a support surface at the bottom of the recess 21. The passages 30 are connected alternatively to a pressure source and a vacuum source. This will be described in more detail in conjunction with FIG. 11. Initially, when the substrate 25 has been clamped to the plate 22 by application of vacuum to passages 26, presurized air is supplied to the passages 30. Plate 22 then floats in the recess 21 and can be readily moved to accurately locate the substrate. Once the substrate, on the plate 22, has been located, the pressure supply to passages 30 is cut off and a vacuum applied. This holds the plate 22 firmly in place on the support member 20.

FIGS. 5 to 13 illustrate a particular embodiment of the invention in more detail. The same reference numerals are used for common items with those of FIGS. 3 and 4, where applicable.

Figure 6:
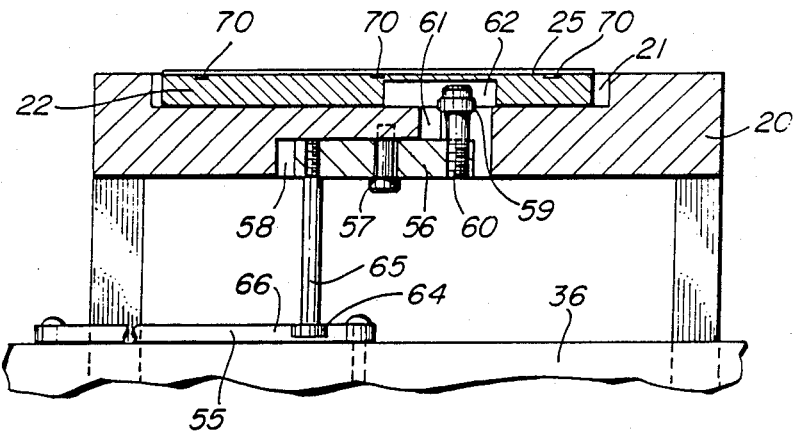
FIG. 6 is a cross-section on the line VI—VI of FIG. 5.
Figure 7:
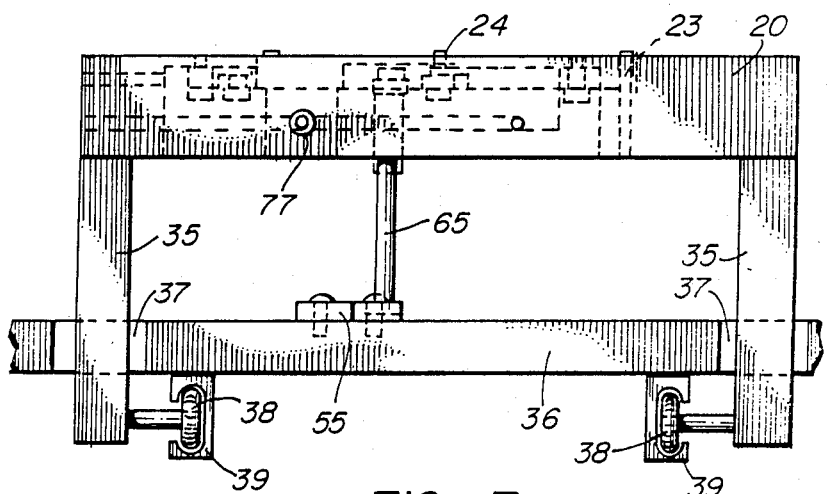
FIG. 7 is an end view in the direction of arrow A in FIG. 5.
Figure 8:
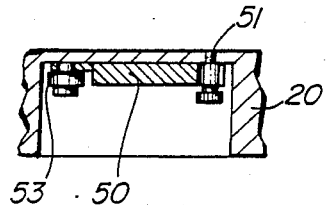
FIG. 8 is a cross-section on the line VIII—VIII of FIG. 5.
Figure 11:
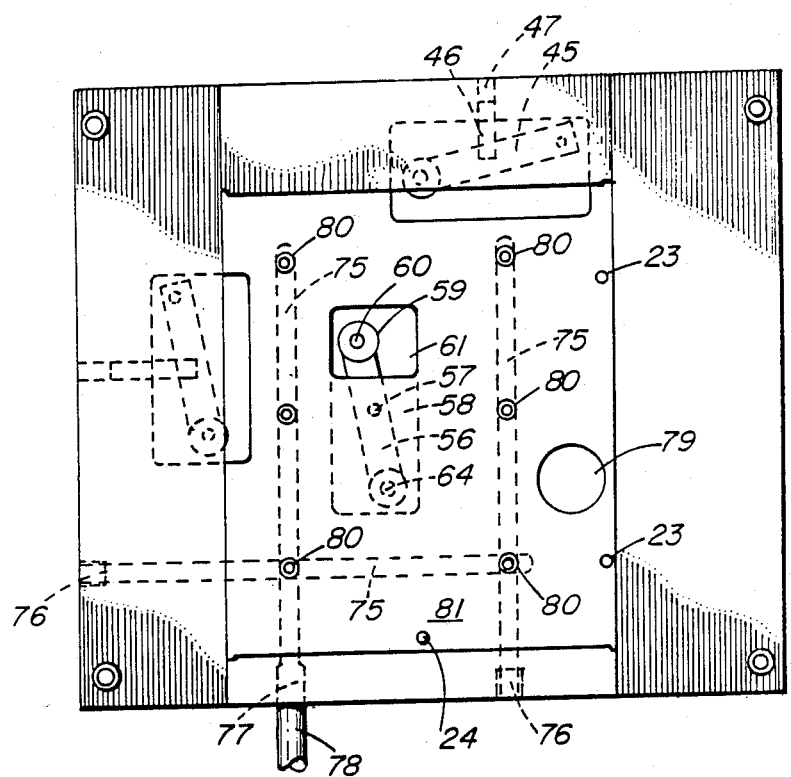
FIG. 11 is a top plan view, similar to that of FIG. 5, but with substrate and intermediate plate removed.

As illustrated particularly in FIG. 7, the support member 20 is mounted on two, parallel, side members 35 for sliding forward and back on a support table 36. The side members 35 extend through slots 37 in the table 36 and are carried by rollers 38, running guide and support rails 39. As seen in FIG. 6, the support member 20 has the recess 21 in which is positioned the intermediate plate 22. On the plate 22 is the ceramic substrate 25. As seen in FIG. 11, on one side of the recess 22 there are two locating pins 23 and at one end is a further locating pin 24. Pins 23 and 24 are fixed in their positions, but carry rotatable bushes to reduce damage to substrate and pins as the substrate is moved into location.

At one end, remote from the pin 24, is a pivotally mounted lever 45. The lever is biased, towards the plate 22, for example by a compression spring 46 extending between the lever 45 and an abutment 47 on the support member 20. At its free end the lever 45 carries a roller 48 which bears against the end surface 49 of the plate 22. On the side remote from the locating pins 23 is pivotally mounted a further lever 50. The lever is mounted at one end about a fixed pivotal position 51 on the support member 20 and is biased for example by a compression spring 52, towards the plate 22. A roller 53 at the free end of the lever 50 bears against a side surface 54 of the plate 22. The levers 45 and 50 are mounted in recesses in the bottom of the support member 20, lever 50 being seen in more detail in FIG. 8.

The support member 20 moves over a fixed cam member 55 mounted on the support table 36. A lever 56 is pivotally mounted at a point 57, intermediate its ends, on the support member 20. The lever 56 is in a recess 58 in the underside of the support member 20. At one end a roller 59 is mounted on a pivot member 60 extending up from the lever 56 through an aperture 61 in the support member. The roller engages in a recess 62 in the bottom of the intermediate plate 22, the roller bearing against a surface 63 of the recess 62, the surface being inclined relative to the direction of movement of the support member 20.

At the other end of the lever 56, a roller 64 is mounted on a pivot member 65 extending down from the lever 56. The roller 64 engages with a cam surface 66 on the cam member 55. In the example, the cam member 55 is a straight member mounted at an angle to the axis of movement of the support member 20.

Figure 5:
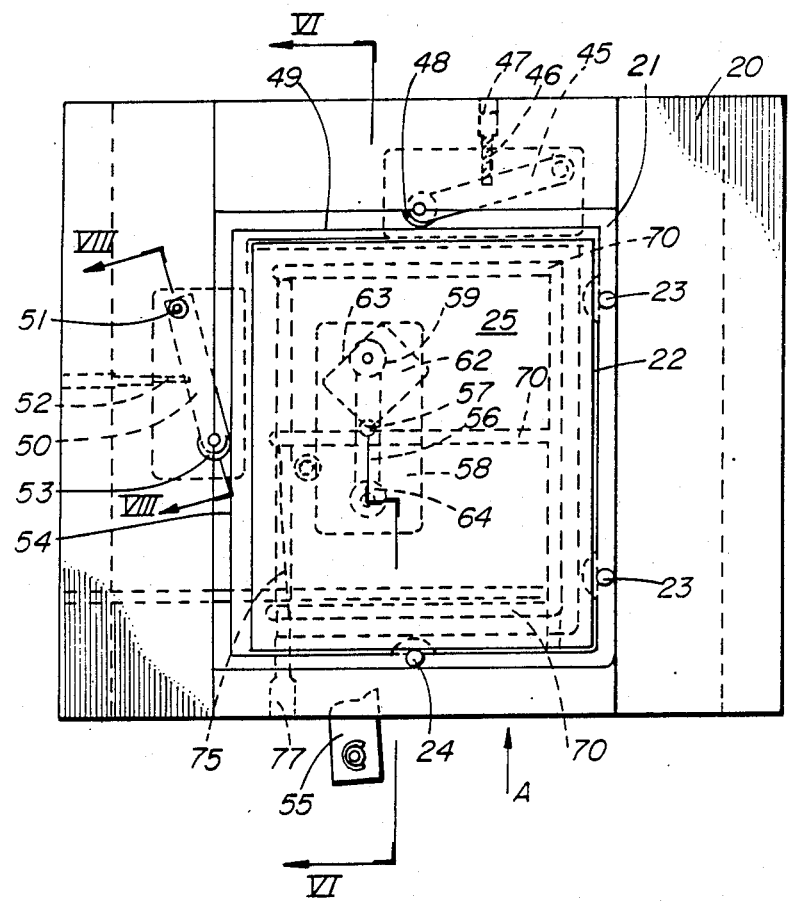
FIG. 5 is a top plan view of an apparatus according to the invention, in a loading condition.

FIG. 5 illustrates the support member 20 in the loading position with the roller 64 engaging with the cam surface 66 of cam member 55. This causes lever 56 to pivot such that roller 59 pushes against surface 63, which in turn pushes the intermediate plate 22 into contact with the walls of the recess 21 against the bias of springs 46 and 52 on levers 45 and 50. The substrate is placed onto the plate 22 and vacuum applied to the groove 70 to clamp the substrate onto the plate.

Figure 9:
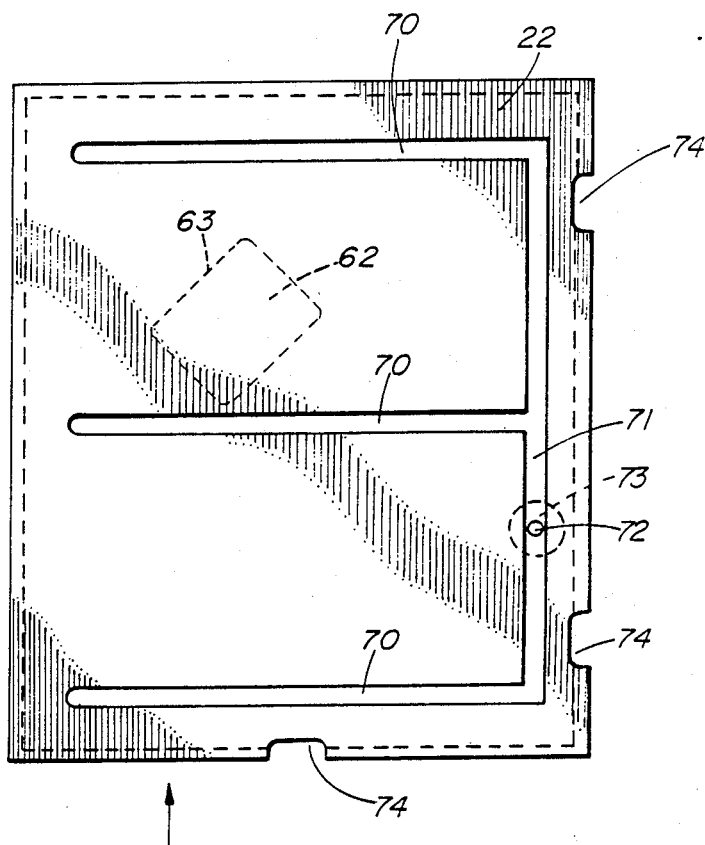
FIG. 9 is a top plan view of the intermediate plate.
Figure 10:
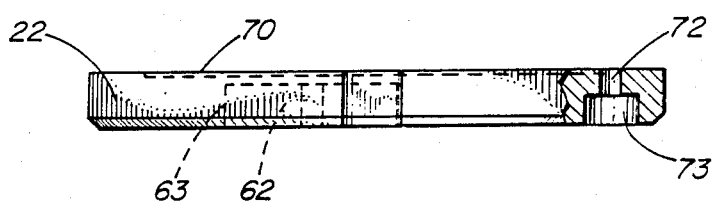
FIG. 10 is an end view in the direction of arrow B in FIG. 9.

FIGS. 9 and 10 illustrate one form of the intermediate plate 22. In the top surface of the plate is formed a shallow E-shaped groove 70. At a convenient position on the back section 71 of the groove is a bore 72 extending up through the plate. This bore is enlarged at its lower end 73, as seen in FIG. 10 which is partly in section to show bore 72 and enlargement 73. A vacuum connection is made to the bore 72 by means of a connector which is screwed or otherwise fixed in the enlargement 73. The plate 22 is recessed on two edges, at 74. The recesses 74 are positioned to align with the pins 23 and 24. This enables the edges of a substrate to overlap the plate 22 at these positions and provides location directly on the substrate edges.

In FIG. 11 can be seen the arrangement for providing air, and for connection of a vacuum, for the air support of, and the vacuum clamping of, the intermediate plate 22. Three passages 75 are formed in the support member, by drilling in from two edges. The passages interconnect and two are blanked off at their outer ends at 76. To the remaining open end there is provided a threaded bore 77 to which is attached a tube 78. A large aperture 79 is provided through which passes the tube connected to the enlargement 73 for connection to a vacuum source. Bores 80 connect to the passages 75 and feed air to and connect the vacuum to the support surface 81.

Figure 13:
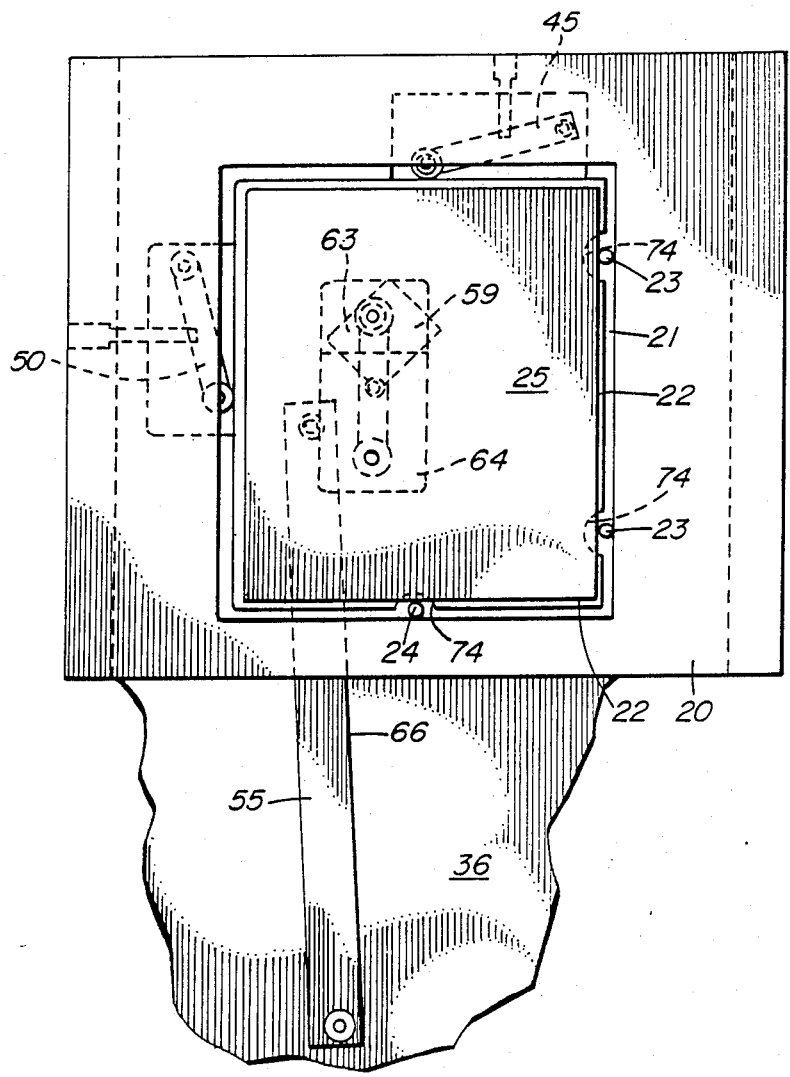
FIG. 13 is a top plan view similar to that of FIG. 5, but with the apparatus in a loaded and located condition.

Once the vacuum has been applied to the intermediate plate to clamp the substrate, air is applied to the support member to support the plate 22 free of the support member. The support member is moved along the table, over the cam member 55, to a processing position. The roller 64 moves along cam surface 66 and gradually releases the intermediate plate so that the levers 45 and 50 can cause the plate 22 to move towards the locating pins 23 and toward locating pin 24. This is provided by the inclination of the surface 63. Initially, as the substrate is unlikely to be placed on the intermediate plate squarely, the substrate will initially contact one of the pins 23 or 24. The substrate will rotate about this pin, and also slide, until it is in contact with all the pins. The rotatable bushes on the pins 23 and 24 assist in this movement and avoiding damage to the substrate. At this time, the roller 64 can be clear of the cam surface 66. This condition is illustrated in FIG. 13. Once the substrate 25, and the intermediate plate 22, are correctly located, the air supply to the support member is shut off and vacuum applied. This firmly holds the plate 22 in position on the support member. The processing steps such as screen printing thick film material, or other material, on the substrate can then be carried out.

On completion of processing, the vacuum connections to the support member and to the plate 22 are shut off, air supplied to the support member to free the plate 22, and the support member slid back. Roller 64 engages with the cam surface 66 and moves the intermediate plate back to the loading position. This is again as illustrated in FIG. 5.

Various changes can be made. Thus other arrangements for moving the plate 22, other than levers 37 and 43, can be provided. Similarly, the control of the movement of the plate 22, by lever 56 and cam member 55, can be varied. In other applications, where movement of the support member is not required, a movable cam member can be used.

While several embodiments of the invention have been described, it will be understood that it is capable of further modification, and this application is intended to cover any variations, uses, or adaptations of the invention, following in general principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A method for locating and supporting a substrate, comprising the steps of:
   (a) placing a substrate on a top surface of an intermediate plate movably supported on a support member;
   (b) applying a vacuum to said top surface of said intermediate plate;
   (c) applying a pressure to a support surface of said support member to provide an air bearing for supporting said intermediate plate;
   (d) moving said intermediate plate towards a locating means fixedly mounted on said support member;
   (e) contacting said substrate with said locating means; and
   (f) applying a vacuum to said support surface of said support member when said substrate is located to hold said intermediate plate.

2. A method for locating and supporting a substrate as recited in claim 1, wherein step (e) further comprises the steps of:
   (a) contacting said substrate with a plurality of locating pins, each said pin having a rotatable bushing;
   (b) rotating and sliding said substrate as it contacts said rotatable bushings.

3. A method for locating and supporting a substrate as recited in claim 1, wherein step (d) further comprises the steps of:
   (a) applying a tension force through spring loaded levers to rollers contacting each said intermediate plate side located opposite said locating means; and
   (b) moving a roller, located at an end of a lever means and contacting an inclined bottom surface of said intermediate plate, toward said locating means along a cam surface under said support surface.

4. A method for locating and supporting a substrate as recited in claim 1, wherein steps (c) and (f) further comprise alternately applying a pressure source and a vacuum source to a threaded bore formed at an end of a first passage in said support member, connecting said first passage to at least one other passage by at least one connecting passage, and plugging each of said other and connecting passages at an edge of said support member.

5. A method for locating and supporting a substrate as recited in claim 1, wherein step (b) further comprises applying a vacuum source to a connector fixed to a bore extending through said intermediate plate, and connecting said bore to a pattern of interconnected shallow grooves in a top surface of said intermediate plate.

* * * * *